(12) United States Patent
Curtis

(10) Patent No.: US 12,369,444 B2
(45) Date of Patent: *Jul. 22, 2025

(54) LOW PROFILE INTERCONNECT FOR LIGHT EMITTER

(71) Applicant: Magic Leap, Inc., Plantation, FL (US)

(72) Inventor: Kevin Curtis, Boulder, CO (US)

(73) Assignee: MAGIC LEAP, INC., Plantation, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 18/476,611

(22) Filed: Sep. 28, 2023

(65) Prior Publication Data
US 2024/0021774 A1    Jan. 18, 2024

Related U.S. Application Data

(60) Continuation of application No. 17/671,477, filed on Feb. 14, 2022, now Pat. No. 11,811,011, which is a
(Continued)

(51) Int. Cl.
H10H 20/857    (2025.01)
F21V 8/00    (2006.01)
(Continued)

(52) U.S. Cl.
CPC ........... *H10H 20/857* (2025.01); *G02B 6/001* (2013.01); *G02B 6/0028* (2013.01); *G02B 6/005* (2013.01);
(Continued)

(58) Field of Classification Search
CPC ....... H01L 33/62; H01L 33/385; H01L 33/52; H01L 2224/24225; H01L 2224/73265;
(Continued)

(56) References Cited

U.S. PATENT DOCUMENTS 6,850,221 B1    2/2005 Tickle
8,727,574 B2    5/2014 Simchak et al.
(Continued)

FOREIGN PATENT DOCUMENTS

CN    1866561 A    11/2006
CN    101494219 A    7/2009
(Continued)

OTHER PUBLICATIONS

ARToolKit: https://web.archive.org/web/20051013062315/http://www.hitl.washington.edu:80/artoolkit/documentation/hardware.htm, archived Oct. 13, 2005.
(Continued)

*Primary Examiner* — Wyatt A Stoffa
*Assistant Examiner* — Mitchell T Oestreich
(74) *Attorney, Agent, or Firm* — KLINTWORTH & ROZENBLAT LLP

(57) ABSTRACT

In some embodiments, an interconnect electrical connects a light emitter to wiring on a substrate. The interconnect may be deposited by 3D printing and lays flat on the light emitter and substrate. In some embodiments, the interconnect has a generally rectangular or oval cross-sectional profile and extends above the light emitter to a height of about 50 μm or less, or about 35 μm or less. This small height allows close spacing between an overlying optical structure and the light emitter, thereby providing high efficiency in the injection of light from the light emitter into the optical structure, such as a light pipe.

20 Claims, 14 Drawing Sheets

Related U.S. Application Data division of application No. 15/441,074, filed on Feb. 23, 2017, now Pat. No. 11,264,548.

(60) Provisional application No. 62/299,163, filed on Feb. 24, 2016.

(51) Int. Cl.
*G02B 27/01* (2006.01)
*H10H 20/01* (2025.01)
*H10H 20/831* (2025.01)
*H10H 20/852* (2025.01)

(52) U.S. Cl.
CPC ......... *G02B 6/0076* (2013.01); *G02B 27/017* (2013.01); *G02B 27/0172* (2013.01); *G02B 2027/0118* (2013.01); *G02B 2027/0134* (2013.01); *G02B 2027/0178* (2013.01); *H01L 2224/24225* (2013.01); *H01L 2224/73265* (2013.01); *H10H 20/0364* (2025.01); *H10H 20/8314* (2025.01); *H10H 20/852* (2025.01)

(58) Field of Classification Search
CPC ............ H01L 2933/0066; G02B 6/001; G02B 6/0028; G02B 6/005; G02B 6/0076; G02B 27/017; G02B 27/0172; G02B 2027/0118; G02B 2027/0134; G02B 2027/0178
USPC ......................................................... 359/630
See application file for complete search history.

(56) References Cited

U.S. PATENT DOCUMENTS

| | | |
|---|---|---|
| 8,950,867 B2 | 2/2015 | Macnamara |
| 9,081,426 B2 | 7/2015 | Armstrong |
| 9,215,293 B2 | 12/2015 | Miller |
| 9,310,559 B2 | 4/2016 | Macnamara |
| 9,348,143 B2 | 5/2016 | Gao et al. |
| D758,367 S | 6/2016 | Natsume |
| 9,417,452 B2 | 8/2016 | Schowengerdt et al. |
| 9,470,906 B2 | 10/2016 | Kaji et al. |
| 9,547,174 B2 | 1/2017 | Gao et al. |
| 9,671,566 B2 | 6/2017 | Abovitz et al. |
| 9,740,006 B2 | 8/2017 | Gao |
| 9,791,700 B2 | 10/2017 | Schowengerdt |
| 9,851,563 B2 | 12/2017 | Gao et al. |
| 9,857,591 B2 | 1/2018 | Welch et al. |
| 9,874,749 B2 | 1/2018 | Bradski et al. |
| 11,264,548 B2 | 3/2022 | Curtis |
| 2006/0028436 A1 | 2/2006 | Armstrong |
| 2006/0126179 A1 | 6/2006 | Levola |
| 2006/0163587 A1 | 7/2006 | Erchak et al. |
| 2006/0262514 A1 | 11/2006 | Conner et al. |
| 2007/0081123 A1 | 4/2007 | Lewis |
| 2007/0081758 A1 | 4/2007 | Tono et al. |
| 2007/0291491 A1 | 12/2007 | Li et al. |
| 2009/0040465 A1 | 2/2009 | Conner et al. |
| 2009/0049983 A1 | 2/2009 | Thelen |
| 2010/0313413 A1* | 12/2010 | Sheats ............... H01L 24/43 29/829 |
| 2011/0186913 A1 | 8/2011 | Suzuki et al. |
| 2011/0273862 A1* | 11/2011 | Li ...................... G03B 21/208 362/555 |
| 2012/0062998 A1 | 3/2012 | Schultz et al. |
| 2012/0127062 A1 | 5/2012 | Bar-Zeev et al. |
| 2012/0162549 A1 | 6/2012 | Gao et al. |
| 2012/0228666 A1 | 9/2012 | Weidner et al. |
| 2013/0043799 A1* | 2/2013 | Siu ..................... H05B 45/30 315/193 |
| 2013/0082922 A1 | 4/2013 | Miller |
| 2013/0117377 A1 | 5/2013 | Miller |
| 2013/0125027 A1 | 5/2013 | Abovitz |
| 2013/0141905 A1 | 6/2013 | Hussell et al. |
| 2013/0208234 A1 | 8/2013 | Lewis |
| 2013/0242262 A1 | 9/2013 | Lewis |
| 2013/0322810 A1 | 12/2013 | Robbins |
| 2014/0003762 A1 | 1/2014 | Macnamara |
| 2014/0049983 A1 | 2/2014 | Nichol et al. |
| 2014/0071539 A1 | 3/2014 | Gao |
| 2014/0140654 A1 | 5/2014 | Brown et al. |
| 2014/0177023 A1 | 6/2014 | Gao et al. |
| 2014/0182887 A1 | 7/2014 | Yoshioka et al. |
| 2014/0218468 A1 | 8/2014 | Gao et al. |
| 2014/0218883 A1 | 8/2014 | Dakhiya et al. |
| 2014/0225132 A1 | 8/2014 | Livesay et al. |
| 2014/0239318 A1 | 8/2014 | Oyu |
| 2014/0267420 A1 | 9/2014 | Schowengerdt et al. |
| 2014/0306866 A1 | 10/2014 | Miller et al. |
| 2015/0016777 A1 | 1/2015 | Abovitz et al. |
| 2015/0021628 A1 | 1/2015 | Medendorp et al. |
| 2015/0103306 A1 | 4/2015 | Kaji et al. |
| 2015/0177443 A1 | 6/2015 | Faecke et al. |
| 2015/0178939 A1 | 6/2015 | Bradski et al. |
| 2015/0205126 A1 | 7/2015 | Schowengerdt |
| 2015/0222883 A1 | 8/2015 | Welch |
| 2015/0222884 A1 | 8/2015 | Cheng |
| 2015/0268415 A1 | 9/2015 | Schowengerdt et al. |
| 2015/0302652 A1 | 10/2015 | Miller et al. |
| 2015/0309263 A2 | 10/2015 | Abovitz et al. |
| 2015/0326570 A1 | 11/2015 | Publicover et al. |
| 2015/0346490 A1 | 12/2015 | Tekolste et al. |
| 2015/0346495 A1 | 12/2015 | Welch et al. |
| 2016/0011419 A1 | 1/2016 | Gao |
| 2016/0026253 A1 | 1/2016 | Bradski et al. |
| 2016/0198576 A1 | 7/2016 | Lewis et al. |
| 2017/0005287 A1 | 1/2017 | Suzuki et al. |
| 2017/0244013 A1 | 8/2017 | Curtis |
| 2022/0173295 A1 | 6/2022 | Curtis |

FOREIGN PATENT DOCUMENTS

| | | |
|---|---|---|
| CN | 101834174 A | 9/2010 |
| CN | 101939849 A | 1/2011 |
| CN | 101950097 A | 1/2011 |
| CN | 101999059 A | 3/2011 |
| CN | 102494272 A | 6/2012 |
| CN | 102686936 A | 9/2012 |
| CN | 103119512 A | 5/2013 |
| CN | 103823267 A | 5/2014 |
| CN | 104022216 A | 9/2014 |
| CN | 104167411 A | 11/2014 |
| CN | 104407468 A | 3/2015 |
| CN | 104408214 A | 3/2015 |
| CN | 104409632 A | 3/2015 |
| CN | 104541100 A | 4/2015 |
| CN | 104676320 A | 6/2015 |
| CN | 104737061 A | 6/2015 |
| JP | 2004335596 A | 11/2004 |
| JP | 2007065080 A | 3/2007 |
| JP | 2010503004 A | 1/2010 |
| JP | 2011243666 A | 12/2011 |
| JP | 2012142525 A | 7/2012 |
| JP | 2013505561 A | 2/2013 |
| JP | 5580499 B1 | 8/2014 |
| JP | 2014195064 A | 10/2014 |
| JP | 2015516693 A | 6/2015 |
| KR | 1020080039904 A | 5/2008 |
| KR | 1020120099706 A | 9/2012 |
| TW | 200804727 A | 1/2008 |
| TW | 201311054 A | 3/2013 |
| TW | 201421086 A | 6/2014 |
| WO | WO2007146373 A2 | 12/2007 |
| WO | WO2010087336 A1 | 8/2010 |
| WO | WO2010087366 A1 | 8/2010 |
| WO | WO2011022610 A1 | 2/2011 |
| WO | WO2011032853 A1 | 3/2011 |
| WO | WO2014209994 A2 | 12/2014 |
| WO | WO2015079543 A1 | 6/2015 |
| WO | WO2017147322 A1 | 8/2017 |

(56) References Cited

FOREIGN PATENT DOCUMENTS

OTHER PUBLICATIONS

Azuma, "A Survey of Augmented Reality," Teleoperators and Virtual Environments 6, 4 (Aug. 1997), pp. 355-385. https://web.archive.org/web/20010604100006/http://www.cs.unc.edu/~azuma/ARpresence.pdf.

Azuma, "Predictive Tracking for Augmented Realty," TR95-007, Department of Computer Science, UNC-Chapel Hill, NC, Feb. 1995.

Bimber, et al., "Spatial Augmented Reality—Merging Real and Virtual Worlds," 2005 https://web.media.mit.edu/~raskgr/book/BimberRaskarAugmentedRealityBook.pdf.

European Partial Supplemental Search Report, re EP Application No. 17757228.6, dated Sep. 26, 2019.

International Search Report and Written Opinion for PCT Application No. PCT/US17/19178, dated Aug. 28, 2018.

International Search Report and Written Opinion for PCT Application No. PCT/US17/19178, dated May 10, 2017.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Jacob, Prof., "ENEE 359a Digital Electronics," Interconnects. University of Maryland ECE Dept. 47 page slide presentation 2004, Download from: https://ece.umd.edu/class/enee359a/enee359a-wires.pdf.

Spice, The Wire, Chapter 4. Detailed wire models for SPICE. pp. 103-143, dated Sep. 6, 1999. Downloaded from: http://bwrcs.eecs.berkeley.edu/Classes/icdesign/ee141_f01/Notes/chapter4.pdf.

Tanriverdi and Jacob, "Interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

\* cited by examiner

LOW PROFILE INTERCONNECT FOR LIGHT EMITTER

CROSS-REFERENCE TO RELATED APPLICATIONS

This application is a continuation of U.S. application Ser. No. 17/671,477, filed on Feb. 14, 2022, entitled LOW PROFILE INTERCONNECT FOR LIGHT EMITTER. U.S. application Ser. No. 17/671,477 is a divisional application of U.S. application Ser. No. 15/441,074, filed Feb. 23, 2017, LOW PROFILE INTERCONNECT FOR LIGHT EMITTER. U.S. application Ser. No. 15/441,074 is a nonprovisional of and claims the benefit of priority under 35 U.S.C. § 119(e) of U.S. Provisional Application No. 62/299,163, filed on Feb. 24, 2016, entitled LOW PROFILE INTERCONNECT FOR LIGHT EMITTER. This application claims priority, and incorporates by reference, each of U.S. application Ser. No. 17/671,477, U.S. application Ser. No. 15/441,074, and U.S. Provisional Application No. 62/299,163.

This application also incorporates by reference the entirety of each of the following patent applications and publications: U.S. application Ser. No. 14/555,585 filed on Nov. 27, 2014; U.S. application Ser. No. 14/690,401 filed on Apr. 18, 2015; U.S. application Ser. No. 14/212,961 filed on Mar. 14, 2014; and U.S. application Ser. No. 14/331,218 filed on Jul. 14, 2014.

BACKGROUND

Field

The present disclosure relates to light sources and, more particularly, to light sources with light emitters mounted on substrates. In some embodiments, the light emitters may be light emitting diodes.

Description of the Related Art

Light emitters mounted on substrates, such as light emitting diodes mounted on circuit boards, are used as light sources to provide illumination in various electronic devices. The substrates may include wire bonds that connect the light emitters with wiring on the substrates, to provide power to the light emitters. As the specifications for modern devices change, e.g., as requirements for efficiency, robustness, and/or compactness increase, there is a continuing need to develop light sources that can meet the needs of these modern devices.

SUMMARY

In some embodiments, an illumination system is provided. The illumination system comprises a substrate comprising a substrate bond pad. A light emitter is attached to the substrate, and the light emitter comprises a light emitter bond pad. An electrical interconnect is over the light emitter. The electrical interconnect contacts the light emitter bond pad at one end of the electrical interconnect and contacts the substrate bond pad at an other end of the electrical interconnect. The cross-sectional shape of the electrical interconnect, as viewed in a plane traverse to an elongate axis of the electrical interconnect, has a width larger than a height. A maximum height of the electrical interconnect above the light emitter may be 50 µm or less in some embodiments. The electrical interconnect may conformally follow contours of the light emitter in some embodiments.

In some other embodiments, a method for making an illumination device is provided. The method comprises providing a light emitter, comprising a light emitter bond pad, over a substrate comprising a substrate bond pad. The method further comprises depositing an electrical interconnect over the light emitter and in contact with the light emitter bond pad and the substrate bond pad. Depositing the electrical interconnect may comprise 3D printing the electrical interconnect in some embodiments.

BRIEF DESCRIPTION OF THE DRAWINGS

It will be appreciated that the drawings are provided to illustrate example embodiments and are not intended to limit the scope of the disclosure. Like reference numerals refer to like features throughout.

DETAILED DESCRIPTION

Light emitters may be coupled to overlying optical structures (e.g., light pipes) that receive light from the light emitters to, e.g., further transmit that light and/or to modify the light. It will be appreciated that the efficiency of the injection of light from the light emitter into the optical structures is strongly dependent on the distance separating the light emitter and the optical structure. Smaller separations provide higher efficiencies, with a higher percentage of the emitted light being injected into the optical structures. The impact of smaller separations can increase with decreases in the widths or transverse dimensions of the optical structures and light emitters; as a transverse dimension decreases, more power is lost around the edges by light missing the optical structure. For example, where the optical structure and light emitter dimensions in transverse directions are smaller than 1.5 mm, the impact of the separation on efficiency is readily apparent. Thus, the impact of the separation, between a light emitter and an optical structure that receives light from the light emitter, increases as the cross-sectional areas of the surfaces of the light emitter and optical structure decrease.

Figure 1:
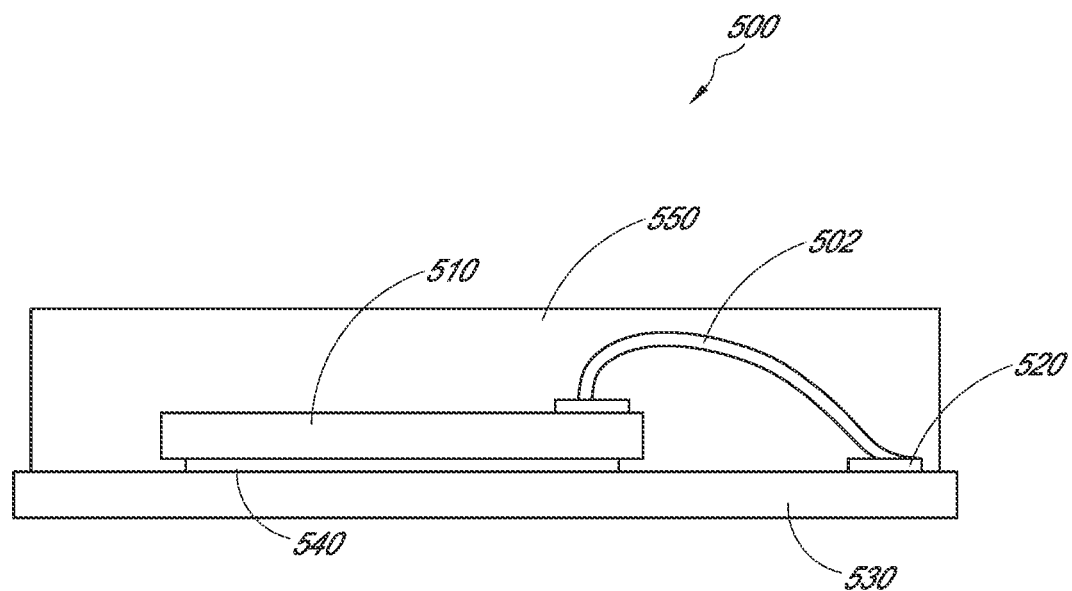
FIG. 1 illustrates an example of a cross-sectional side view of a wire bond connecting a light emitter to a bond pad on a substrate.

As noted above, power may be provided to light emitters using wire bonds. Conventional wire bonds, however, have been found to limit how closely overlying optical structures can be spaced from the light emitters. FIG. 1 illustrates an example of a cross-sectional side view of a light source 500 having a wire bond 502 connecting a light emitter 510 to a bond pad 520 on a substrate 530. An electrical contact 540 provides a second connection between the light emitter 510 and wiring (not shown) in the substrate 530. It will be appreciated that the wire bond 500 and the electrical contact 540 are electrical interconnects and may function as cathodes and anodes for supplying power to the light emitter.

Wire bonds are typically metallic wires with circular cross sections. As illustrated, these wires may gently curve upwards and then downwards to the bond pad to, e.g., prevent breakage that may be caused by making sharp corners with the wires. The upward curvature adds to the height of a light source that includes the wire bond. In addition, the wire has been found to be undesirable for display systems, since it may block light from light emitter and form a shadow that may cause a visual artifact in a projected image. The wire bond may also limit how closely adjacent light emitters can be placed onto the substrate, as the wire bond must have a certain loop height above the chip and cannot curve downwards too sharply. In addition, an encapsulating material 550 may be formed around the wire bond 502 and light emitter 510, to provide mechanical protection and electrical insulation for the wire bond 502 and the light emitter 510. The encapsulating material 550 further adds to the height of the light source 500, thereby spacing any optical structures from the light emitter 510 by at least the height of the encapsulating material 550, which in turn has a height dictated by the wire bond 502. [

Advantageously, according to some embodiments, light emitters having exceptionally low profile electrical interconnects are provided. In some embodiments, the interconnects connect a light emitter to bond pads on a substrate. A single light source may include one, or two or more interconnects, each connected to bond pads. The interconnects may have a cross-sectional profile that, as viewed head on, has a width that is larger than a height, e.g., the profile may be generally rectangular or oval-shaped. Preferably, the interconnect is formed by deposition, e.g., by a printing process such as 3D printing, which forms a strip of material over the light emitter. It will be appreciated that the strip, as deposited, has a generally rectangular or oval-shaped cross-section. In some embodiments, a dielectric layer is formed on the light emitter and then the interconnect is deposited. Both the dielectric and the interconnect may be deposited by the same type of deposition, e.g., both may be deposited by 3D printing.

The deposited interconnect may conformally follow the contours of the underlying surface topology, e.g., the contours of the light emitter and any other structures on the substrate, and this topology may be assumed by the conformal dielectric layer, where such a dielectric layer is deposited. In some embodiments, both the interconnect and dielectric layer are strips of material. It will be appreciated that the substrates can include any material that can support electrical circuits, such as standard FR4, ceramic, metallic and combinations thereof.

Advantageously, the interconnect lays flat over the light emitter, thereby protruding only a small amount above the light emitter. In some embodiments, the interconnect connects to a bond pad on top of the light emitter and proximate the edge of light emitting area or outside of light emitting area, which can have advantages for reducing shadow-type artifacts in a projected image. In some embodiments, the interconnect extends above the light emitter to a height of about 50 μm or less, about 35 μm or less, about 25 μm or less, or about 20 μm or less. This small height allows close spacing between an overlying optical structure, e.g., light pipes or reflectors, and the light emitter, thereby providing high efficiency in the injection of light from the light emitter into the optical structure. In some embodiments, because the interconnect lays directly on an underlying material, such as on a deposited dielectric layer, the interconnect may be sufficiently mechanically and environmentally stable to omit use of an encapsulating material. This avoidance of the encapsulating material may provide advantages for simplifying manufacturing and reducing manufacturing costs, while also allowing a closer spacing of an overlying optical structure to the light emitter. In addition, directly forming the interconnect in contact with the substrate surface provides a more robust and shock and vibration-resistant interconnect than a thin bond wire suspended above the light emitter and substrate.

Reference will now be made to the drawings, in which like reference numerals refer to like parts throughout.

Figure 2A:
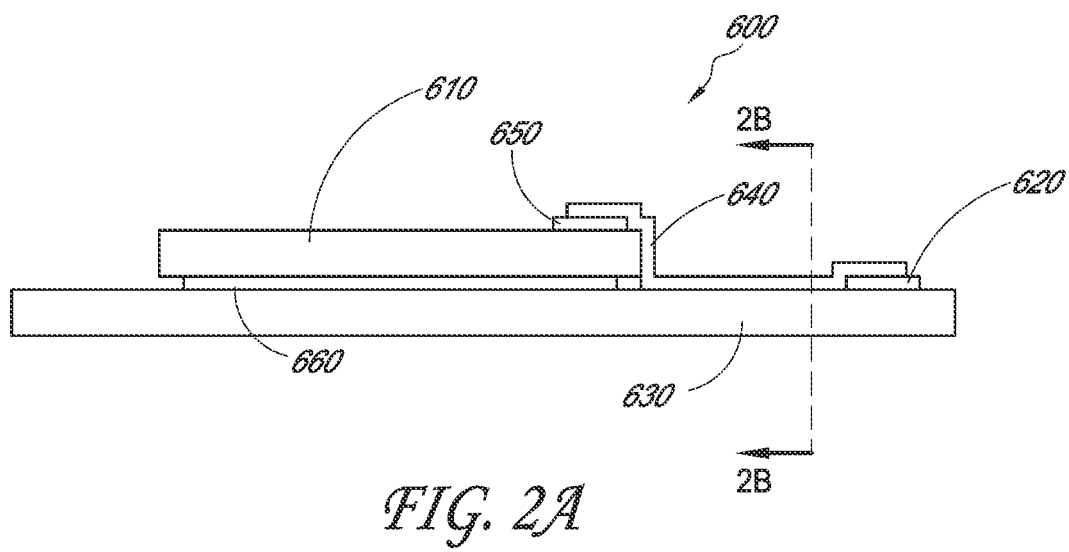
FIG. 2A illustrates an example of a cross-sectional side view of a light source having a light emitter connected to a substrate by a low-profile interconnect.

With reference now to FIG. 2A, an example is illustrated of a cross-sectional side view of a light source 600 having a light emitter 610 connected to a bond pad 620 on a substrate 630 by a low-profile interconnect 640. As illustrated, the light emitter 610 may also have a bond pad 650 to which the interconnect 640 makes direct contact. Thus, the interconnect 640 makes an electrical connection between the bond pad 620 in the substrate 630 and the bond pad 650 on the light emitter 610. In some embodiments, an electrical contact 660 under the light emitter 610 makes another electrical connection to the light emitter 610. One of the interconnect 640 and the electrical contact 660 may function as an anode and the other of the interconnect 640 and the electrical contact 660 may function as a cathode to provide power to the light emitter 610.

It will be appreciated that the bond pads 620 and 650 may be areas of conductive material on or in the light emitter 610 and substrate 630, respectively, to which the interconnect 640 can make a stable electrical contact. In some embodiments, the bond pads 620 and 650 are deposits of material on the light emitter 610 or the substrate 630. Preferably, the bond pads 620 and 650 are formed of metallic material. In some embodiments, the bond pad 620 may be part of wiring on the substrate 630, such as wiring for providing power to the light emitter 610 and may also help to remove heat in some applications, and may have a larger width than the wiring. In some embodiments, the substrate 630 may be a printed circuit board. The wider interconnect 640 may have a lower height or thickness than a wire bond but actually help remove more heat than a wire bond due, e.g., to its larger area, which may allow the interconnect to function as a heat sink. This is advantageous as heat is detrimental to light emitter performance and lifespan.

In some embodiments, the light emitter 610 is a light emitting diode (LED) device, such as a LED chip. In some embodiments, the LED is formed by a semiconductor having p and n-doped regions that form a p-n junction that emits light upon the application of a voltage across the junction.

With continued reference to FIG. 2A, the interconnect 640 may be formed by a deposition process. In some embodiments, the deposition process may be a 3D printing process. Advantageously, 3D printing allows for the selective deposition of material at particular locations, and the deposition may be conformal to facilitate a low height. The 3D printing process may include various processes capable of depositing a continuous layer of conductive material. In some embodiments, the material is a metal. Non-limiting examples of metals include aluminum, gold, and copper. In some embodiments, the width and thickness of the interconnect can be varied along its length for desired mechanical fit or electrical or thermal performance.

Non-limiting examples of 3D printing processes include material extrusion and powder bed fusion. In material extrusion, a supply of material (e.g., a metal) is melted and flowed out of an opening (e.g., an opening in a nozzle) to deposit the interconnect material on a surface. In some embodiments, multiple lines of material may be deposited directly neighboring one another, at the side of another row of material, to increase the width of the deposited interconnect 640 and to increase the amount of deposited material as desired. In addition or alternatively, the lines may be deposited on top of one another to increase the thickness of the deposited interconnect 640.

In powder bed fusion, a loose bed of material (e.g., a bed of metal powder or particles) is selectively heated by a heat source to form a continuous mass of material at the locations of the applied heat, while the unheated portions of the bed remain in powder or particle form and may be subsequently removed. In some embodiments, the heat source may be any heat source capable of supplying sufficient localized energy to sinter or melt the material, thereby forming a solid mass of material to define the interconnect 640. Examples of heat sources include devices that can project a beam of high-energy radiation or particles to the bed of material. For example, the heat sources may be lasers and/or electron beams. In some embodiments, the high-energy beam (e.g., a beam with sufficient energy to sinter or melt particles in the bed of material) may be scanned over the bed of material, thereby sintering or melting the particles together, to form a continuous line of material. In addition, the high-energy beam may be further scanned across the bed of material to form neighboring lines, to extend the width of the interconnect 640 to increase the amount of deposited material. In some embodiments, another bed of material may be deposited over the sintered or melted material, and then exposed to the high-energy beam to increase the height of the deposited interconnect either generally, or at specific locations (such as to extend the interconnect up a side of a wall). In addition to the processes above, other 3D printing processes for depositing dielectric materials may also be used to form the dielectric layer 670.

It will be appreciated while referred to as lines of material, the material deposited by 3D printing extends linearly in some embodiments, but may form a curve or make a turn in some other embodiments, as viewed in a top down view. In addition, as seem in FIG. 2A, the interconnect 640 is deposited conformally on the light emitter 610 and the substrate 630; that is, as seem in a side view, the profile of the interconnect 640 may conform to and track the profile of the underlying light emitter 610 and substrate 30.

As noted herein, the interconnect 640 may supply power to the light emitter. It will be appreciated that the resistance of the interconnect 640 will decrease with increases in the head-on cross-sectional area of the interconnect 640 (that is, the cross-sectional area of the interconnect 640 transverse to the length dimension of the interconnect 640 extending from the bond pad 620 to the bond pad 650, which may include the cross-sectional area taken along the plane 2B-2B). As a result, the number of lines of material deposited to form the interconnect 640 is preferably chosen to provide a sufficiently large cross-sectional area to provide power to the light emitter 610 without undue resistance or heat generation.

Figure 2B:
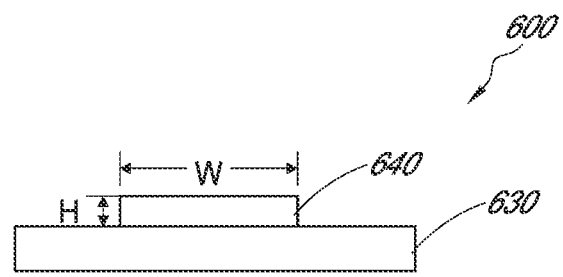
FIG. 2B illustrates an example of a cross-sectional view of the light source of FIG. 2A, as seem in a cross-section taken along the plane 2B-2B of FIG. 2A.

In some embodiments, the interconnect 640 may have an elongated cross-section. FIG. 2B illustrates an example of a cross-sectional view of the illumination system of FIG. 2A, as seen in a cross-section taken along the plane 2B-2B of FIG. 2A. The plane 2B-2B is traverse to an elongate axis of the interconnect 640 (e.g., traverse to the axis along which the interconnect 640 extends from the bond pad 620 to the bond pad 650); the view illustrated in FIG. 2B may be considered to be the view of the interconnect 640 as seem head on. As illustrated, the interconnect 640 has a width W and a height H. In some embodiments, W is larger than H, which can have advantages for providing a low-profile interconnect, while also allowing sufficient material to achieve a desirably low resistance. In some embodiments, W is larger than H by a factor of about 1.5 or more, 50 or more, or 100 or more.

Figure 3:
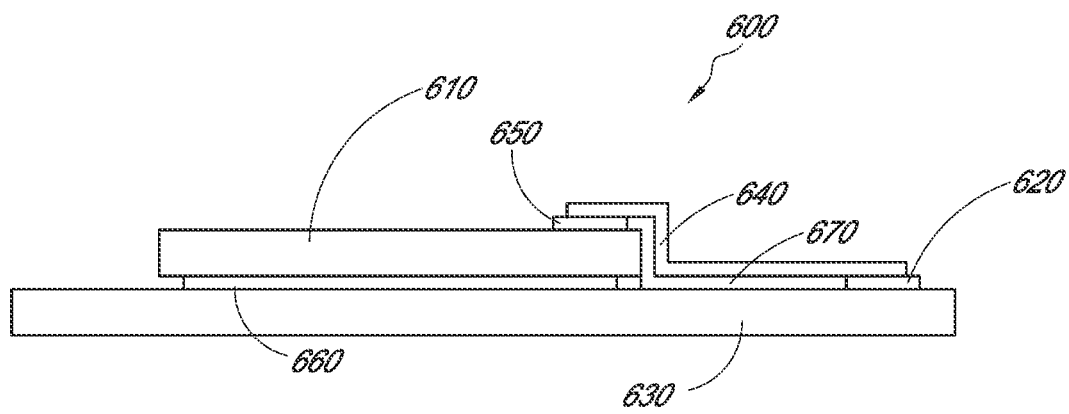
FIG. 3 illustrates an example of a cross-sectional side view of a light source having a dielectric layer underlying a low-profile interconnect.

It will be appreciated that the light emitter 610 and/or the substrate 630 may have conductive materials within them or on them. For example, where the light emitter is a LED chip, the light emitter 610 may be formed of a semiconductor die, which can conduct electricity. In some embodiments, the substrate 670 may include conductive features, such as wire traces or a bond pad for the electrical contact 660 that extends beyond the light emitter 660. For example, this arrangement may be found in some ceramic circuit boards. To prevent undesired contact or shorting of the interconnect 640 with other conductive features, a dielectric layer may be formed along the path of the interconnect 640 before depositing that interconnect 640. FIG. 3 illustrates an example of a cross-sectional side view of the light source 600 having a dielectric layer 670 underlying a low-profile interconnect 640. In some embodiments, the dielectric layer 670 may be a strip of material that traces the path of the interconnect 640, and that is wider than and extends beyond the sides of the interconnect 640. In some other embodiments, the dielectric layer 670 may be a blanket layer of dielectric overlies portions of the substrate 630 and the light emitter 610.

In some embodiments, the dielectric layer 670 may be deposited by 3D printing. The 3D printing process for depositing the dielectric layer 670 may include various processes capable of depositing a continuous layer of dielectric material. Non-limiting examples of dielectric materials include epoxies, resins, glues, plastics, polycarbonates, and other polymer based materials.

Non-limiting examples of 3D printing processes include material extrusion, powder bed fusion, material jetting, binder jetting. Material extrusion and powder bed fusion may be similar to that described above for deposition of the interconnect 640, except that a dielectric material may be deposited instead of a conductive material. Material jetting may be performed by jetting droplets or liquid streams of material out of a nozzle and then hardening that material by the application of energy (e.g., heat and/or light). Binder jetting may be performed by applying a powder on a surface and jetting droplets or liquid streams of binder material out of a nozzle on the powder to bind the powder together. In addition to the processes above, other 3D printing processes for depositing dielectric materials may also be used to form the dielectric layer 670.

Figure 4:
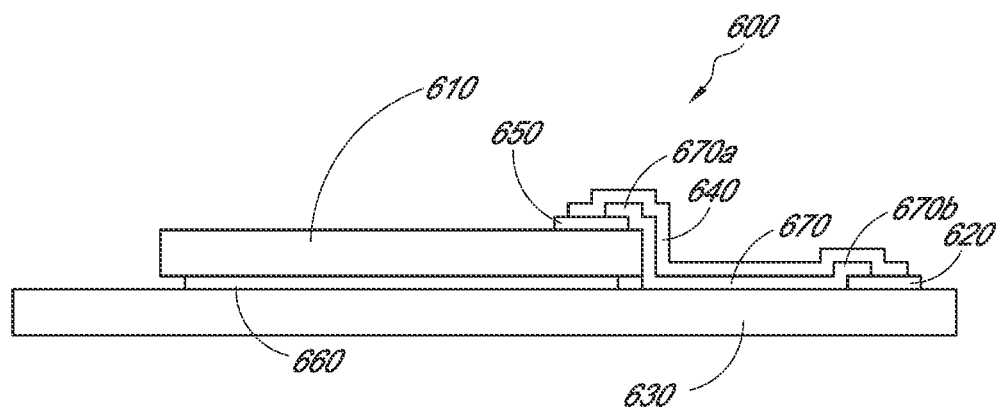
FIG. 4 illustrates another example of a cross-sectional side view of a light source having a dielectric layer underlying a low-profile interconnect.

It will be appreciated that the dielectric layer 670 may extend over parts of one or both of the bonds pads 620 and 650. FIG. 4 illustrates an example of a cross-sectional side view of the light source 600 having the dielectric layer 670 underlying the interconnect 650 and also partly overlying the bond pads 620 and 650. As illustrated, an end 670*a* of the dielectric layer 670 overlies a portion of the bond pad 620 and an end 670*b* of the dielectric layer 670 overlies a portion of the bond pad 650. In some embodiments, the dielectric layer 670 lies conformally over the substrate 630, the light emitter 610, and the bond pads 620 and/or 650. In turn, the interconnect 640 conformally follows the contours of the light emitter 610 and the bond pads 620 and 650. As illustrated, the interconnect 640 may directly contact the dielectric layer 670, in addition to directly contacting the bond pads 620 and 650. In some embodiments, the dielectric layer may be transparent or partly transparent to the light emitted by the light emitter 610 and thus cover all or portions of the light emitter without significantly blocking the emitted light.

Figure 5:
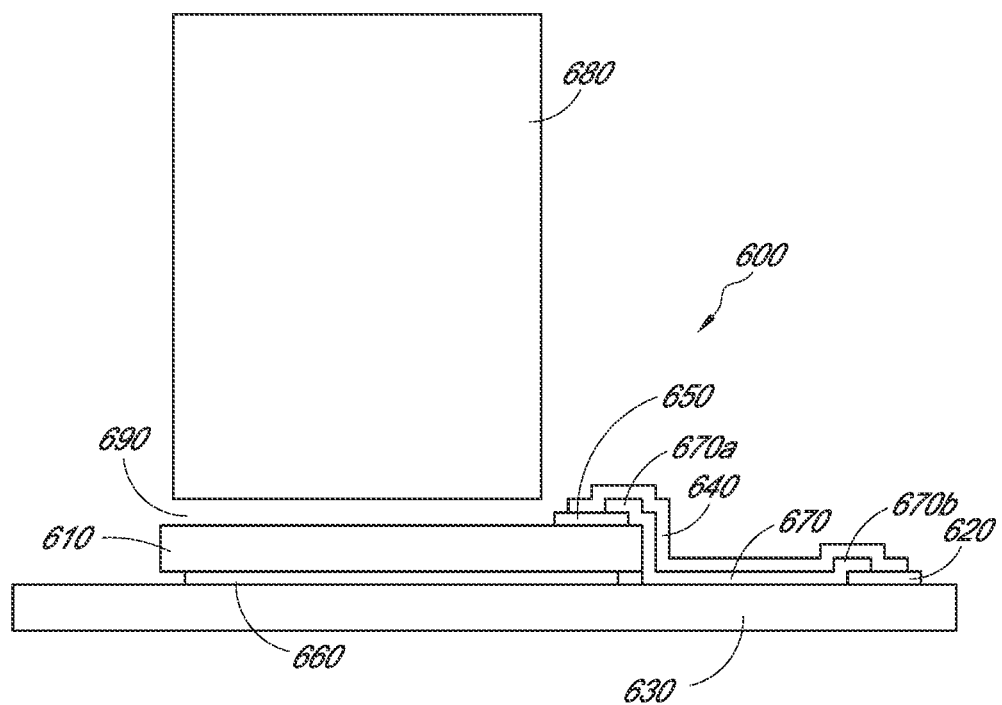
FIG. 5 illustrates an example of a cross-sectional side view of the light source of FIG. 4 having a light pipe over the light emitter.

The low profile of the interconnect 640 allows small spacing between the light emitter 610 and an overlying structure. FIG. 5 illustrates an example of a cross-sectional side view of the light source 600 having an optical structure 680 over the light emitter 610. In some embodiments, the optical structure 680 is a light collection structure such as a light pipe. The light emitter 610 is configured to inject light into the optical structure 680 through a gap 690. In some embodiments, the height of the gap 690, or the distance separating the optical structure 680 from the light emitter 610, is about 150 µm or less, about 50 µm or less, about 25 µm or less, or about 20 µm or less. In some embodiments, the light emitter 610 may be exposed, with a gap 690, filled with air, separating the light emitter 610 from the optical structure 680.

In some other embodiments, a material other than air may fill the gap 690. For example, a transparent adhesive or resin may fill the gap. Preferably, the material filling the gap may be formed of a material with a refractive index that substantially matches the refractive index of the material of the optical structure 680, where the optical structure 680 is a light pipe.

It will be appreciated that the light pipe is formed of an optically transmissive material and may be used to transmit light. Non-limiting examples of optically transmissive materials include poly(methyl methacrylate) (PMMA) and other acrylics, glass, polycarbonate, or any other optical grade polymeric material. Light injected into the light pipe 680 may propagate through the light pipe by total internal reflection (TIR). In some embodiments, TIR is facilitated by providing a low refractive index material at the sides of the light pipe. For example, the low index material may be air or a cladding layer having a refractive index that is less than the refractive index of the light pipe by 0.1 or more.

In some embodiments, the optical structure 680 is a reflective light collection system. For example, the light collection system may include a reflector such as a circular or elecptical cone or a Compound Parabolic Concentrator (CPC).

Figure 6:
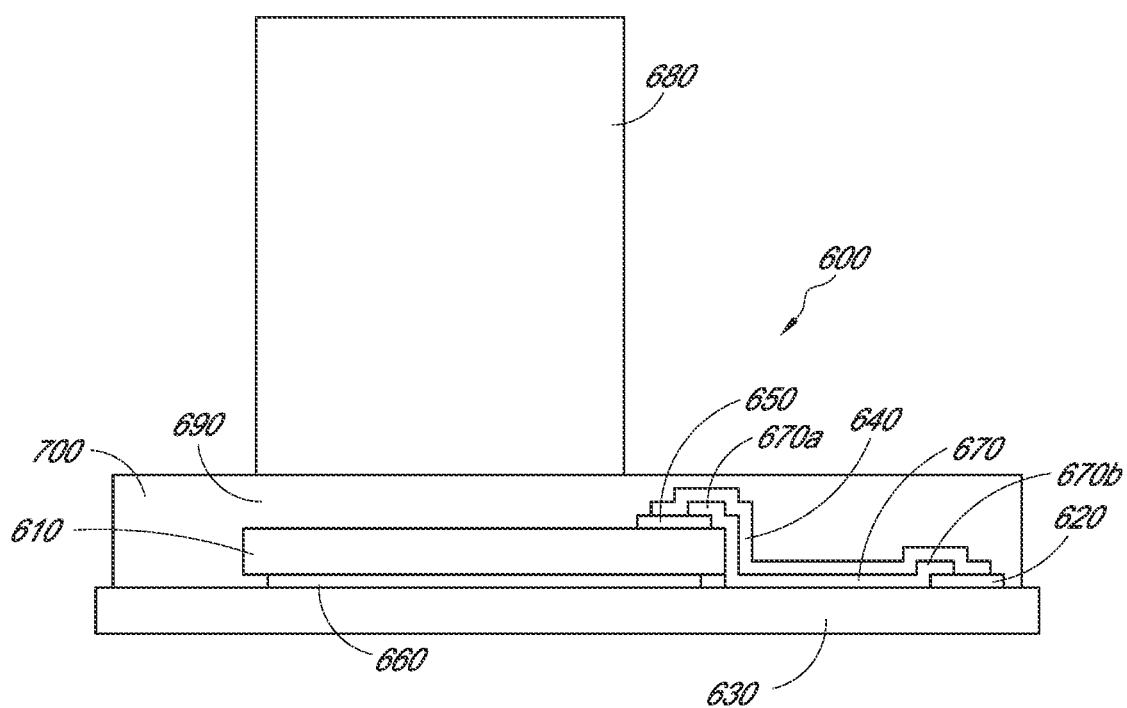
FIG. 6 illustrates an example of a cross-sectional side view of the light source of FIG. 5 having an encapsulating material over the light emitter and a light pipe over the encapsulating material.

It will be appreciated that that the light emitter 610 and interconnect 640 may be encapsulated using an optically transmissive encapsulating material. FIG. 6 illustrates an example of a cross-sectional side view of the light source 600 of FIG. 5 having an encapsulating material 700 over the light emitter 610 and the optical structure 680 over the encapsulating material. As shown, the gap 690 may be filled by the encapsulating material 700 and the optical structure 680 may be disposed immediately over and in contact with the encapsulating material 700. The encapsulating material 700 may protect the light emitter 610 and the interconnect 640. Non-limiting examples of encapsulating materials include silicone and epoxy resin. In some embodiments, a gap 690 created by the thickness of the encapsulating material 690 between the light emitter 610 and the optical structure 680 separates the light emitter 640 and the optical structure 680 by about 50 µm or less, about 40 µm or less, or about 10 µm or less or in contact with.

Figure 7:
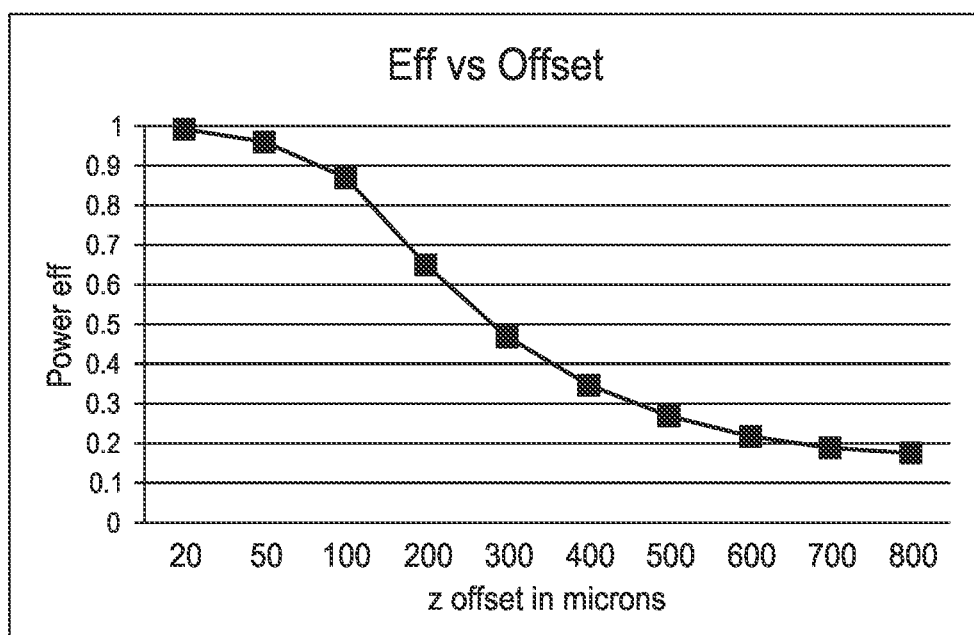
FIG. 7 is a plot showing the power efficiency of a light pipe as a function of distance between the light pipe and a light emitter.

The small separation between the light emitter 640 and the optical structure 680 has been found to significantly impact the power efficiency of light emitters. FIG. 7 is a plot showing the power efficiency of a light pipe as a function of distance between the light pipe and a light emitter. The power efficiency is on the y-axis and the distance between the light pipe and the light emitter is on the x-axis. The power efficiency may be understood to be the percentage of the total amount of outputted light from the light emitter which is captured and subsequently outputted by the light pipe. Notably, at distances of 50 µm or less, the power efficiency is 90% or higher, while the power efficiency falls down steeply at distances of 50 µm or more and, more particularly, 100 µm or more. As result, maintaining a gap 690 between the light emitter 610 and the optical structure 680 at distances of about 50 µm or less, about 35 µm or less, about 25 µm or less, or about 20 µm or less are expected to provide exceptionally high power efficiency.

In the example above, the transverse dimensions of the light pipe are about 400×400 um. A light emitter for such a light pipe may fall in the range of about 10×10 um to about 700×700 um. If the light emitter is too small, insufficient light is generated to begin with. If the light emitter is too large and a large proportion of the light misses the light pipe or reflector system, although the large size makes the system more robust to misalignment. As the size of the light collector get smaller then the gap must be less to keep the efficiency of the system.

Referring both to FIGS. 5 and 6, as examples, the illustrated light source 600 may be similar to the configuration of the light source illustrated FIG. 4. In some other embodiments, the light source 600 may have any of the configurations discussed herein, e.g., such as the configurations illustrated in FIGS. 2A-3.

Example Display Systems

It will be appreciated that the low-profile interconnects may be utilized in various illumination applications in which a low profile over the light emitter is desired. As discussed therein, the low profile can provide tight spacing between the light emitter and an overlying optical structure, such as a light pipe. This tight spacing can allow for highly efficient transfer of light from the light emitter into the light pipe. Another advantage is that, by eliminating the wire bond, the interconnect can be more robust against shock and vibration as well as environmental concerns. In addition, these interconnects may allow for the light sources to be placed closer together which can make the optical system smaller and lighter weight, for a given level of output. Such high efficiency, robustness, and small size may advantageously be utilized in display devices, to increase the brightness and portability and/or reduce the power usage of the displays.

In some embodiments, the light emitters may be used to illuminate augmented or virtual reality display systems. In some embodiments, these display systems may by wearable and portable, with present images on multiple depth planes, with light sources required for each depth plane. The high efficiency provided with the low-profile interconnects can advantageously facilitate the portability of the display system, e.g., by reducing power requirements and the increasing battery life of power sources and reducing the size for the display system. These concerns may be particularly important for optical systems that use multiple light sources for illumination.

Figure 8:
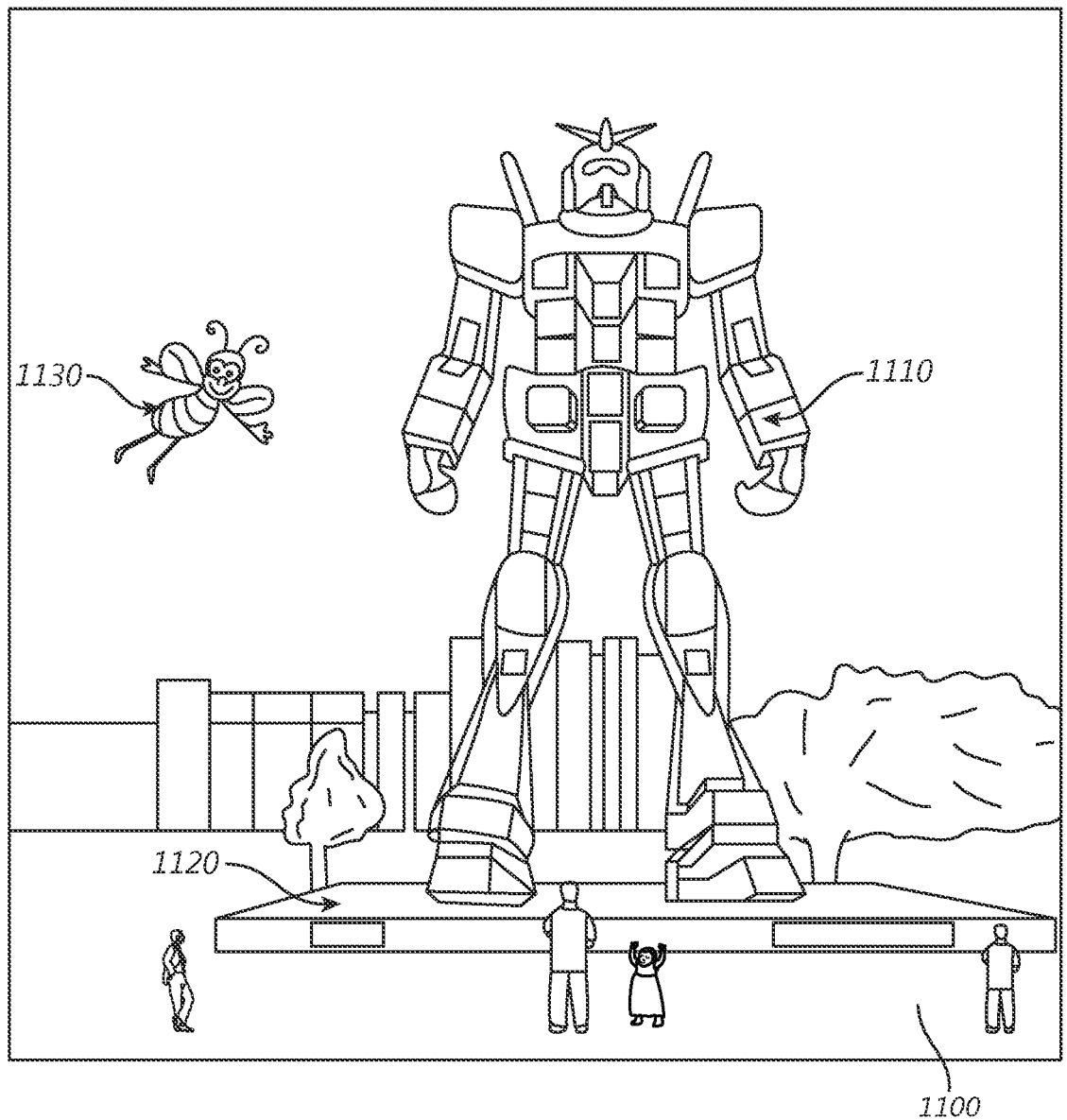
FIG. 8 illustrates a user's view of augmented reality (AR) through an AR device.

With reference to FIG. 8, an augmented reality scene 1 is depicted. It will be appreciated that modern computing and display technologies have facilitated the development of systems for so called "virtual reality" or "augmented reality" experiences, wherein digitally reproduced images or portions thereof are presented to a user in a manner wherein they seem to be, or may be perceived as, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user. A mixed reality, or "MR", scenario is a type of AR scenario and typically involves virtual objects that are integrated into, and responsive to, the natural world. For example, an MR scenario may include AR image content that appears to be blocked by or is otherwise perceived to interact with objects in the real world.

FIG. 8 shows an example of an AR scene in which a user of an AR technology sees a real-world park-like setting 1100 featuring people, trees, buildings in the background, and a concrete platform 1120. In addition to these items, the user of the AR technology also perceives that he "sees" a robot statue 1110 standing upon the real-world platform 1120, and a cartoon-like avatar character 1130 flying by which seems to be a personification of a bumble bee, even though these elements 1130, 1110 do not exist in the real world. Because the human visual perception system is complex, it is challenging to produce a VR or AR technology that facilitates a comfortable, natural-feeling, rich presentation of virtual image elements amongst other virtual or real-world imagery elements.

Figure 9:
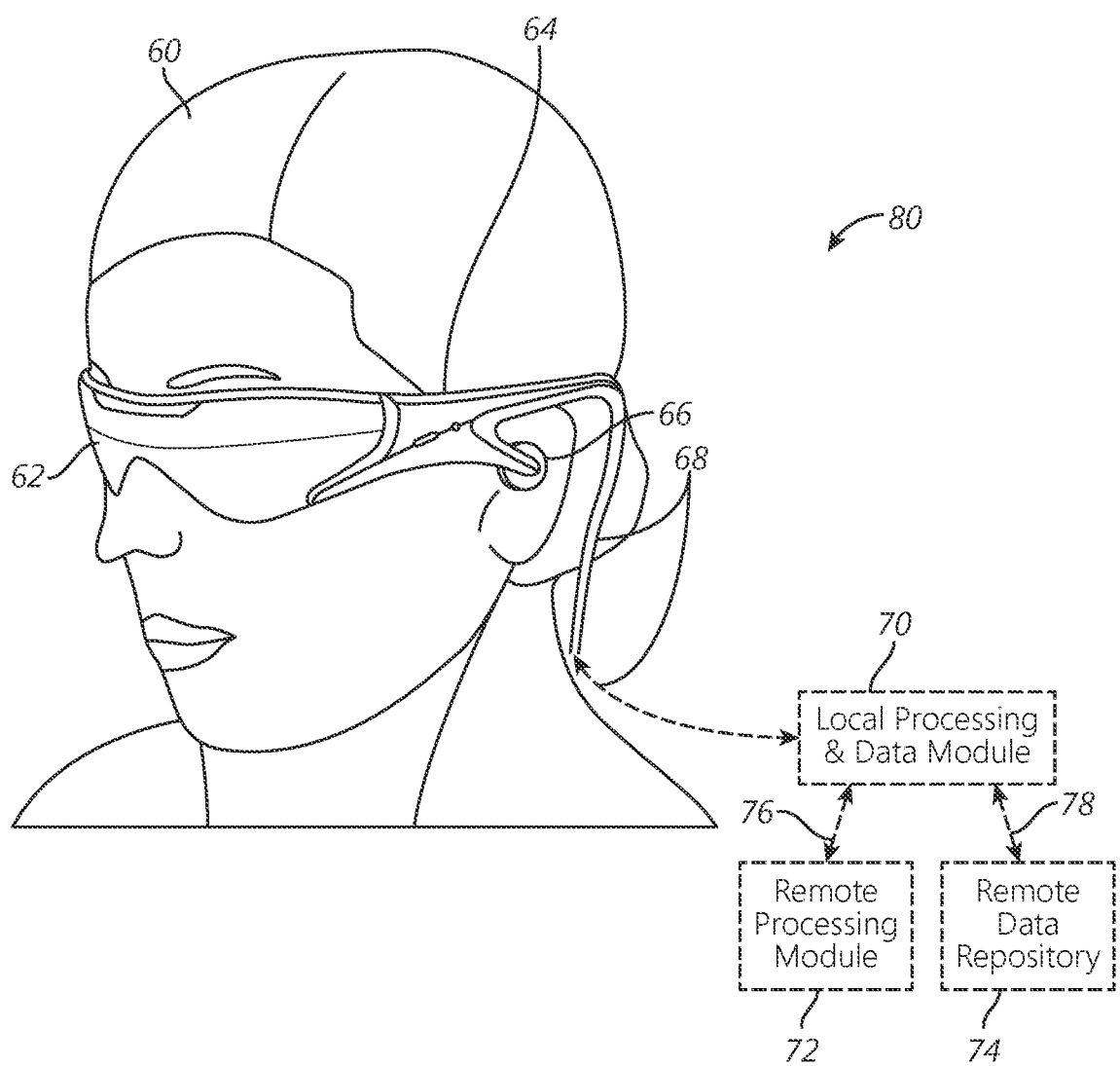
FIG. 9 illustrates an example of wearable display system.

FIG. 9 illustrates an example of wearable display system 80. The display system 80 includes a display 62, and various mechanical and electronic modules and systems to support the functioning of that display 62. The display 62 may be coupled to a frame 64, which is wearable by a display system user or viewer 60 and which is configured to position the display 62 in front of the eyes of the user 60. The display may be considered eyewear in some embodiments. In some embodiments, a speaker 66 is coupled to the frame 64 and positioned adjacent the ear canal of the user 60 (in some embodiments, another speaker, not shown, is positioned adjacent the other ear canal of the user to provide for stereo/shapeable sound control). In some embodiments, the display system may also include one or more microphones or other devices to detect sound. In some embodiments, the microphone is configured to allow the user to provide inputs or commands to the system 80 (e.g., the selection of voice menu commands, natural language questions, etc.) and/or may allow audio communication with other persons (e.g., with other users of similar display systems).

With continued reference to FIG. 9, the display 62 is operatively coupled 68, such as by a wired lead or wireless connectivity, to a local data processing module 70 which may be mounted in a variety of configurations, such as fixedly attached to the frame 64, fixedly attached to a helmet or hat worn by the user, embedded in headphones, or otherwise removably attached to the user 60 (e.g., in a backpack-style configuration, in a belt-coupling style configuration). The local processing and data module 70 may comprise a hardware processor, as well as digital memory, such as non-volatile memory (e.g., flash memory or hard disk drives), both of which may be utilized to assist in the processing, caching, and storage of data. The data include data a) captured from sensors (which may be, e.g., operatively coupled to the frame 64 or otherwise attached to the user 60), such as image capture devices (such as cameras), microphones, inertial measurement units, accelerometers, compasses, GPS units, radio devices, and/or gyros; and/or b) acquired and/or processed using remote processing module 72 and/or remote data repository 74, possibly for passage to the display 62 after such processing or retrieval. The local processing and data module 70 may be operatively coupled by communication links 76, 78, such as via a wired or wireless communication links, to the remote processing module 72 and remote data repository 74 such that these remote modules 72, 74 are operatively coupled to each other and available as resources to the local processing and data module 70. In some embodiments, the local processing and data module 70 may include one or more of the image capture devices, microphones, inertial measurement units, accelerometers, compasses, GPS units, radio devices, and/or gyros. In some other embodiments, one or more of these sensors may be attached to the frame 64, or may be standalone structures that communicates with the location processing and data module 70 by wired or wireless communication pathways.

With continued reference to FIG. 9, in some embodiments, the remote processing module 72 may comprise one or more processors configured to analyze and process data and/or image information. In some embodiments, the remote data repository 74 may comprise a digital data storage facility, which may be available through the internet or other networking configuration in a "cloud" resource configuration. In some embodiments, the remote data repository 74 may include one or more remote servers, which provide information, e.g., information for generating augmented reality content, to the local processing and data module 70 and/or the remote processing module 72. In some embodiments, all data is stored and all computations are performed in the local processing and data module, allowing fully autonomous use from a remote module.

Figure 10:
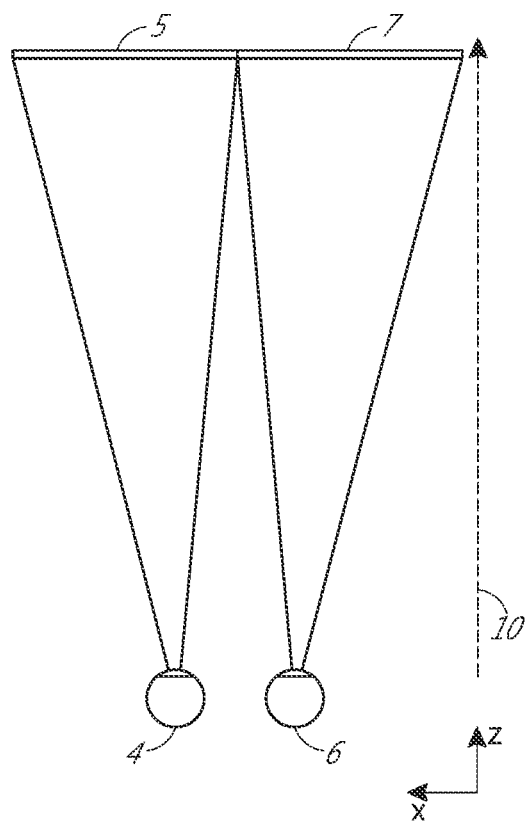
FIG. 10 illustrates a conventional display system for simulating three-dimensional imagery for a user.

The perception of an image as being "three-dimensional" or "3-D" may be achieved by providing slightly different presentations of the image to each eye of the viewer. FIG. 10 illustrates a conventional display system for simulating three-dimensional imagery for a user. Two distinct images 5, 7—one for each eye 4, 6—are outputted to the user. The images 5, 7 are spaced from the eyes 4, 6 by a distance 10 along an optical or z-axis parallel to the line of sight of the viewer. The images 5, 7 are flat and the eyes 4, 6 may focus on the images by assuming a single accommodated state. Such systems rely on the human visual system to combine the images 5, 7 to provide a perception of depth for the combined image.

It will be appreciated, however, that the human visual system is more complicated and providing a realistic perception of depth is more challenging. For example, many viewers of conventional "3-D" display systems find such systems to be uncomfortable or may not perceive a sense of depth at all. Without being limited by theory, it is believed that viewers of an object may perceive the object as being "three-dimensional" due to a combination of vergence and accommodation. Vergence movements (i.e., rolling movements of the pupils toward or away from each other to converge the lines of sight of the eyes to fixate upon an object) of the two eyes relative to each other are closely associated with focusing (or "accommodation") of the lenses of the eyes. Under normal conditions, a change in vergence of the eyes when shifting attention from one object to another object at a different distance will automatically cause a matching change in the focus of the lenses of the eyes, or accommodation of the eyes, under a relationship known as the "accommodation-vergence reflex." Likewise, a change in accommodation will trigger a matching change in vergence, under normal conditions. As noted herein, many stereoscopic or "3-D" display systems display a scene using slightly different presentations (and, so, slightly different images) to each eye such that a three-dimensional perspective is perceived by the human visual system. Such systems are uncomfortable for many viewers, however, since they, among other things, simply provide a different presentations of a scene, but with the eyes viewing all the image information at a single accommodated state, and work against the "accommodation-vergence reflex." Display systems that provide a better match between accommodation and vergence may form more realistic and comfortable simulations of three-dimensional imagery.

Figure 11:
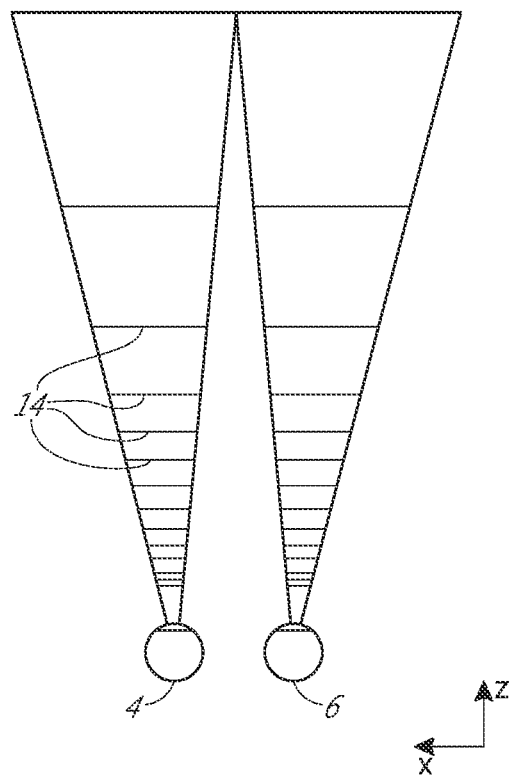
FIG. 11 illustrates aspects of an approach for simulating three-dimensional imagery using multiple depth planes.

FIG. 11 illustrates aspects of an approach for simulating three-dimensional imagery using multiple depth planes. Objects at various distances from eyes 4, 6 on the z-axis are accommodated by the eyes 4, 6 so that those objects are in focus. The eyes (4 and 6) assume particular accommodated states to bring into focus objects at different distances along the z-axis. Consequently, a particular accommodated state may be said to be associated with a particular one of depth planes 14, with has an associated focal distance, such that objects or parts of objects in a particular depth plane are in focus when the eye is in the accommodated state for that depth plane. In some embodiments, three-dimensional imagery may be simulated by providing different presentations of an image for each of the eyes 4, 6, and also by providing different presentations of the image corresponding to each of the depth planes. While shown as being separate for clarity of illustration, it will be appreciated that the fields of view of the eyes 4, 6 may overlap, for example, as distance along the z-axis increases. It will addition, while shown as flat for ease of illustration, it will be appreciated that the contours of a depth plane may be curved in physical space, such that all features in a depth plane are in focus with the eye in a particular accommodated state.

Figure 12A:
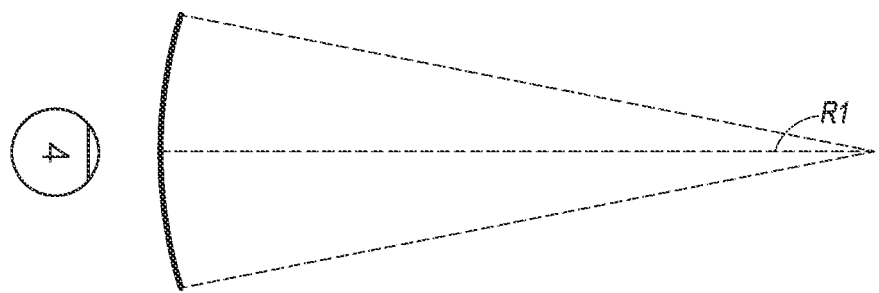
FIGS. 12A-12C illustrate relationships between radius of curvature and focal radius.
Figure 12B:
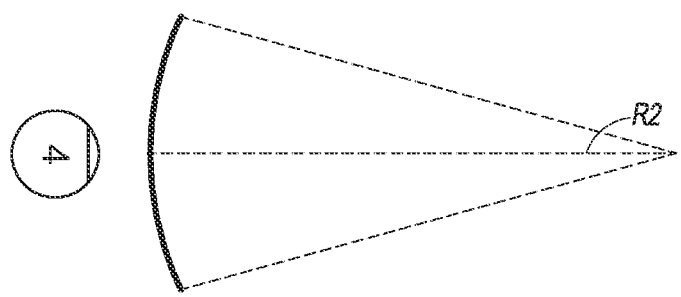
Figure 12C:
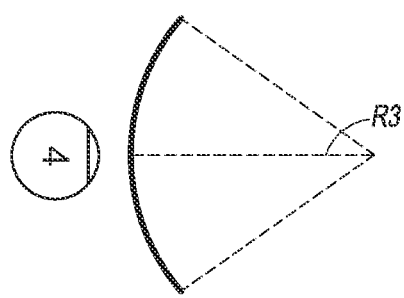

The distance between an object and the eye 4 or 6 can also change the amount of divergence of light from that object, as viewed by that eye. FIGS. 12A-12C illustrates relationships between distance and the divergence of light rays. The distance between the object and the eye 4 is represented by, in order of decreasing distance, R1, R2, and R3. As shown in FIGS. 12A-12C, the light rays become more divergent as distance to the object decreases. As distance increases, the light rays become more collimated. Stated another way, it may be said that the light field produced by a point (the object or a part of the object) has a spherical wavefront curvature, which is a function of how far away the point is from the eye of the user. The curvature increases with decreasing distance between the object and the eye 4. Consequently, at different depth planes, the degree of divergence of light rays is also different, with the degree of divergence increasing with decreasing distance between depth planes and the viewer's eye 4. While only a single eye 4 is illustrated for clarity of illustration in FIGS. 12A-12C and other figures herein, it will be appreciated that the discussions regarding eye 4 may be applied to both eyes 4 and 6 of a viewer.

Without being limited by theory, it is believed that the human eye typically can interpret a finite number of depth planes to provide depth perception. Consequently, a highly believable simulation of perceived depth may be achieved by providing, to the eye, different presentations of an image corresponding to each of these limited number of depth planes. The different presentations may be separately focused by the viewer's eyes, thereby helping to provide the user with depth cues based on the accommodation of the eye required to bring into focus different image features for the scene located on different depth plane and/or based on observing different image features on different depth planes being out of focus.

Figure 13:
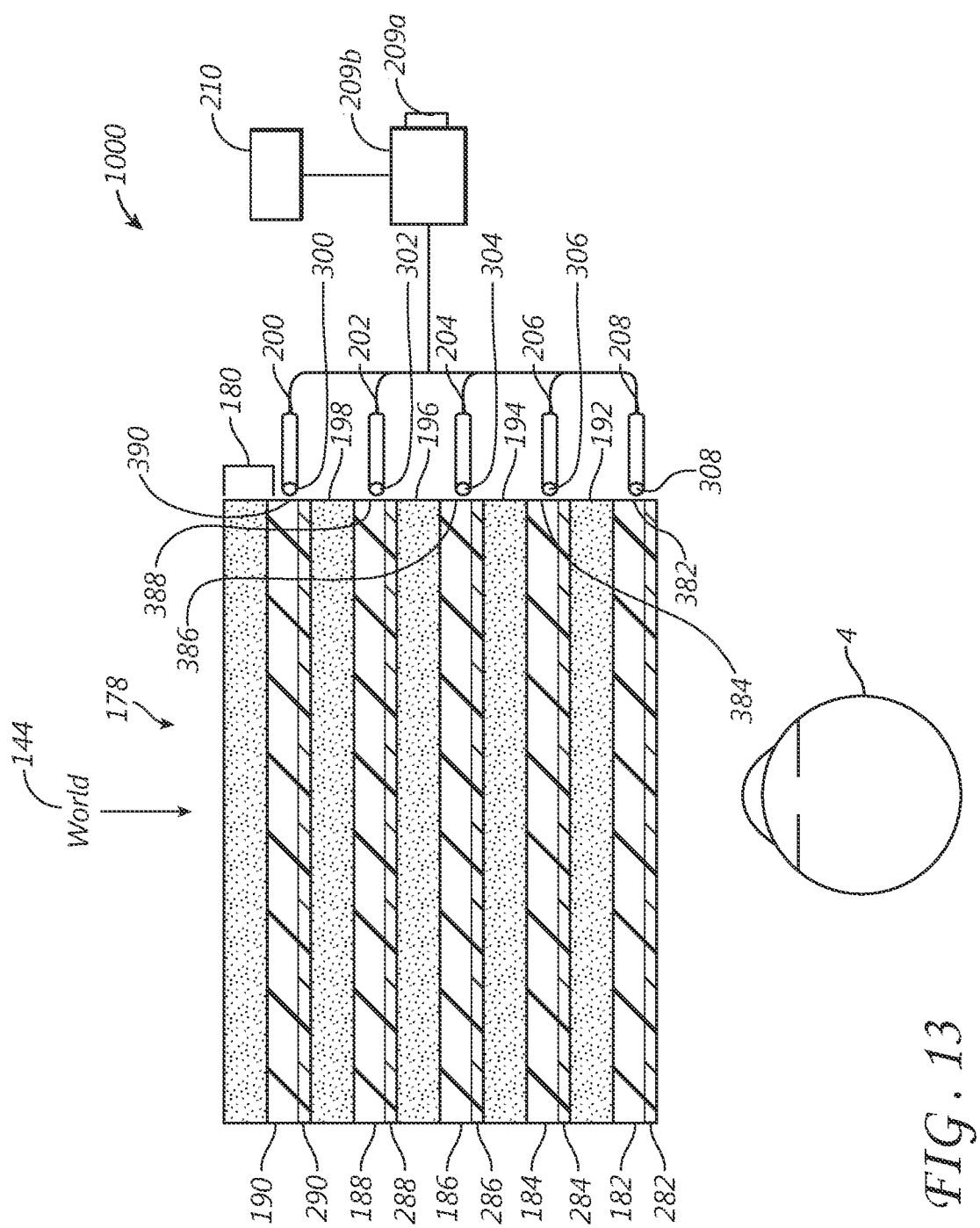
FIG. 13 illustrates an example of a waveguide stack for outputting image information to a user.

FIG. 13 illustrates an example of a waveguide stack for outputting image information to a user. A display system 1000 includes a stack of waveguides, or stacked waveguide assembly, 178 that may be utilized to provide three-dimensional perception to the eye/brain using a plurality of waveguides 182, 184, 186, 188, 190. In some embodiments, the display system 1000 is the system 80 of FIG. 9, with FIG. 13 schematically showing some parts of that system 80 in greater detail. For example, the waveguide assembly 178 may be part of the display 62 of FIG. 9. It will be appreciated that the display system 1000 may be considered a light field display in some embodiments.

With continued reference to FIG. 13, the waveguide assembly 178 may also include a plurality of features 198, 196, 194, 192 between the waveguides. In some embodiments, the features 198, 196, 194, 192 may be lens. The waveguides 182, 184, 186, 188, 190 and/or the plurality of lenses 198, 196, 194, 192 may be configured to send image information to the eye with various levels of wavefront curvature or light ray divergence. Each waveguide level may be associated with a particular depth plane and may be configured to output image information corresponding to that depth plane. Image injection devices 200, 202, 204, 206, 208 may function as a source of light for the waveguides and may be utilized to inject image information into the waveguides 182, 184, 186, 188, 190, each of which may be configured, as described herein, to distribute incoming light across each respective waveguide, for output toward the eye 4. These light sources may be made more efficient and may be spaced closer together using the interconnects disclosed herein. By using different sources the light sources themselves act to switch depth planes by switching on or off the illumination for each depth plane, as desired. Light exits an output surface 300, 302, 304, 306, 308 of the image injection devices 200, 202, 204, 206, 208 and is injected into a corresponding input surface 382, 384, 386, 388, 390 of the waveguides 182, 184, 186, 188, 190. In some embodiments, the each of the input surfaces 382, 384, 386, 388, 390 may be an edge of a corresponding waveguide, or may be part of a major surface of the corresponding waveguide (that is, one of the waveguide surfaces directly facing the world 144 or the viewer's eye 4). In some embodiments, a single beam of light (e.g. a collimated beam) may be injected into each waveguide to output an entire field of cloned collimated beams that are directed toward the eye 4 at particular angles (and amounts of divergence) corresponding to the depth plane associated with a particular waveguide. In some embodiments, a single one of the image injection devices 200, 202, 204, 206, 208 may be associated with and inject light into a plurality (e.g., three) of the waveguides 182, 184, 186, 188, 190.

In some embodiments, the image injection devices 200, 202, 204, 206, 208 are discrete displays that each produce image information for injection into a corresponding waveguide 182, 184, 186, 188, 190, respectively. In some other embodiments, the image injection devices 200, 202, 204, 206, 208 are the output ends of a single multiplexed display which may, e.g., pipe image information via one or more optical conduits (such as fiber optic cables) to each of the image injection devices 200, 202, 204, 206, 208. It will be appreciated that the image information provided by the image injection devices 200, 202, 204, 206, 208 may include light of different wavelengths, or colors (e.g., different component colors, as discussed herein).

In some embodiments, the light injected into the waveguides 182, 184, 186, 188, 190 is provided by a light output module 209a, which may include a light source, such as the light source 600 (FIGS. 2A-4). The light from the light output module 209a may be modified by a light modulator 209b, e.g., a spatial light modulator. The light modulator 209b may be configured to change the perceived intensity of the light injected into the waveguides 182, 184, 186, 188, 190. Examples of spatial light modulators include liquid crystal displays (LCD), including a liquid crystal on silicon (LCOS), and a digital light processing (DLP) displays. While not illustrated, it will be appreciated that various other optical structures (e.g., polarizing beam splitters) may be provided between the light output module 209a and the light modulator 209b to direct the propagation of light as desired to facilitate the propagation of light from the light output module 209A to the light modulator 209B and from the light modulator 209B to the waveguides 182, 184, 186, 188, 190.

Figure 15:
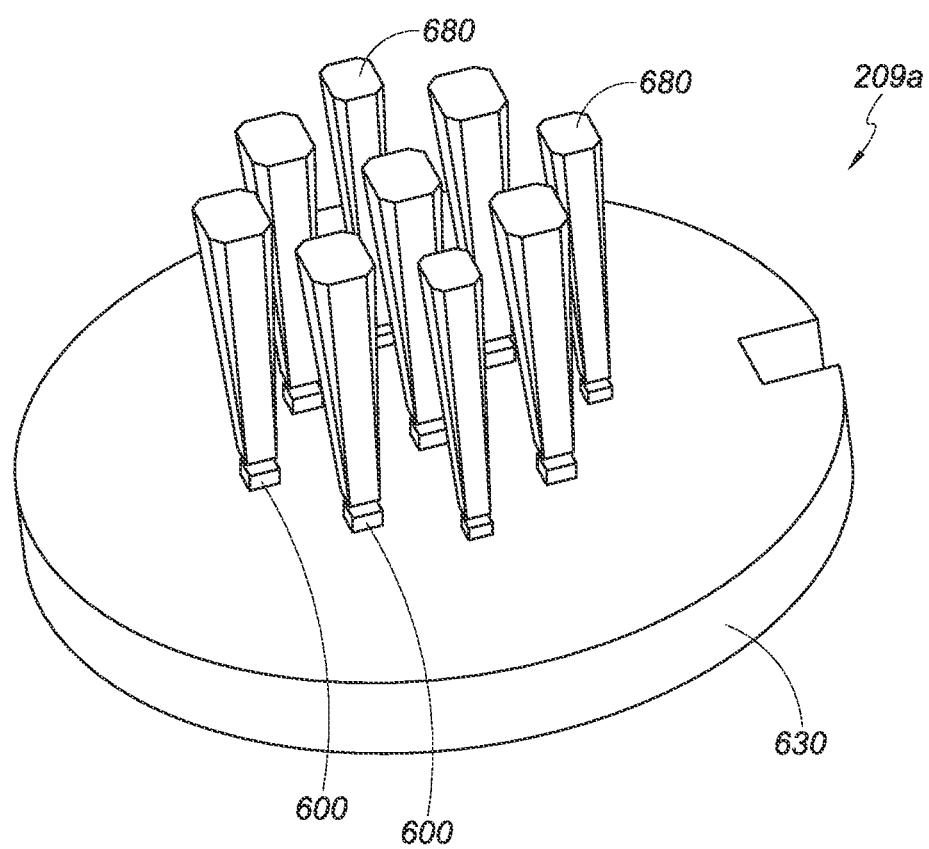
FIG. 15 illustrates a perspective view of a light module having a plurality of light emitters and a plurality of light collectors.

In some embodiments, the light output module 209a may include multiple light collectors 680, e.g., light pipes or reflectors, as shown in FIG. 15. Each light collector 680 may be configured to output light (e.g., by transmitting and/or reflecting the light) into the light modulator 209b (FIG. 13). These light pipes or reflectors 680 may each be optically coupled with one or more associated light sources 600 arranged in patterns on the substrate 630 (e.g., a printed circuit board) and the low-profile interconnects according to some embodiments may advantageously be employed to provide electrical connections in these light sources 600. In some embodiments, the light emitters 610 (FIG. 5) of the light sources 600 may be smaller than 1.5×1.5 mm, or smaller than 800×800 um or smaller than 300×300 um in some embodiments. As discussed herein, for these smaller sized light emitters, a given distance between the collectors 680 and the light emitter has a more significant impact on the amount of light collected by the light collector 680 then for larger light emitters. Also, where multiple light sources 600 are employed, the impact of the efficiency of light collection caused by the closeness between the light collectors 680 and the light emitters of each light source 600 are magnified, since the multiple light sources 600 will see the impact of low efficiency light collection in the aggregate. Advantageously, light sources 600 with the low-profile interconnects disclosed herein can provide a higher light collection efficiency, which may be particularly beneficial where multiple light sources 600 are employed. The light output module 209a may also include a housing and baffles (not shown) for, respectively, enclosing and preventing light leakage between light collectors 680 and between light sources 600.

With reference again to FIG. 13, a controller 210 controls the operation of one or more of the stacked waveguide assembly 178, including operation of the image injection devices 200, 202, 204, 206, 208, the light emitter 209a, and the light modular 209b. In some embodiments, the controller 210 is part of the local data processing module 70. The controller 210 includes programming (e.g., instructions in a non-transitory medium) that regulates the timing and provision of image information to the waveguides 182, 184, 186, 188, 190 according to, e.g., any of the various schemes disclosed herein. In some embodiments, the controller may be a single integral device, or a distributed system connected by wired or wireless communication channels. The controller 210 may be part of the processing modules 70 or 72 (FIG. 9) in some embodiments.

With continued reference to FIG. 13, the waveguides 182, 184, 186, 188, 190 may be configured to propagate light within each respective waveguide by total internal reflection (TIR). The waveguides 182, 184, 186, 188, 190 may each be planar or have another shape (e.g., curved), with major top and bottom surfaces and edges extending between those major top and bottom surfaces. In the illustrated configuration, the waveguides 182, 184, 186, 188, 190 may each include outcoupling optical elements 282, 284, 286, 288, 290 that are configured to extract light out of a waveguide by redirecting the light, propagating within each respective waveguide, out of the waveguide to output image information to the eye 4. Extracted light may also be referred to as outcoupled light and the outcoupling optical elements light may also be referred to light extracting optical elements. An extracted beam of light is outputted by the waveguide at locations at which the light propagating in the waveguide strikes a light extracting optical element. The outcoupling optical elements 282, 284, 286, 288, 290 may, for example, be gratings, including diffractive optical features, as discussed further herein. While illustrated disposed at the bottom major surfaces of the waveguides 182, 184, 186, 188, 190 for ease of description and drawing clarity, in some embodiments, the outcoupling optical elements 282, 284, 286, 288, 290 may be disposed at the top and/or bottom major surfaces, and/or may be disposed directly in the volume of the waveguides 182, 184, 186, 188, 190, as discussed further herein. In some embodiments, the outcoupling optical elements 282, 284, 286, 288, 290 may be formed in a layer of material that is attached to a transparent substrate to form the waveguides 182, 184, 186, 188, 190. In some other embodiments, the waveguides 182, 184, 186, 188, 190 may be a monolithic piece of material and the outcoupling optical elements 282, 284, 286, 288, 290 may be formed on a surface and/or in the interior of that piece of material.

With continued reference to FIG. 13, as discussed herein, each waveguide 182, 184, 186, 188, 190 is configured to output light to form an image corresponding to a particular depth plane. For example, the waveguide 182 nearest the eye may be configured to deliver collimated light, as injected into such waveguide 182, to the eye 4. The collimated light may be representative of the optical infinity focal plane. The next waveguide up 184 may be configured to send out collimated light which passes through the first lens 192 (e.g., a negative lens) before it can reach the eye 4; such first lens 192 may be configured to create a slight convex wavefront curvature so that the eye/brain interprets light coming from that next waveguide up 184 as coming from a first focal plane closer inward toward the eye 4 from optical infinity. Similarly, the third up waveguide 186 passes its output light through both the first 192 and second lenses before reaching the eye 4; the combined optical power of the first 192 and second 194 lenses may be configured to create another incremental amount of wavefront curvature so that the eye/brain interprets light coming from the third waveguide 186 as coming from a second focal plane that is even closer inward toward the person from optical infinity than was light from the next waveguide up 184.

The other waveguide layers 188, 190 and lenses 196, 198 are similarly configured, with the highest waveguide 190 in the stack sending its output through all of the lenses between it and the eye for an aggregate focal power representative of the closest focal plane to the person. To compensate for the stack of lenses 198, 196, 194, 192 when viewing/interpreting light coming from the world 144 on the other side of the stacked waveguide assembly 178, a compensating lens layer 180 may be disposed at the top of the stack to compensate for the aggregate power of the lens stack 198, 196, 194, 192 below. Such a configuration provides as many perceived focal planes as there are available waveguide/lens pairings. Both the outcoupling optical elements of the waveguides and the focusing aspects of the lenses may be static (i.e., not dynamic or electro-active). In some alternative embodiments, either or both may be dynamic using electro-active features.

In some embodiments, two or more of the waveguides 182, 184, 186, 188, 190 may have the same associated depth plane. For example, multiple waveguides 182, 184, 186, 188, 190 may be configured to output images set to the same depth plane, or multiple subsets of the waveguides 182, 184, 186, 188, 190 may be configured to output images set to the same plurality of depth planes, with one set for each depth plane. This can provide advantages for forming a tiled image to provide an expanded field of view at those depth planes.

With continued reference to FIG. 13, the outcoupling optical elements 282, 284, 286, 288, 290 may be configured to both redirect light out of their respective waveguides and to output this light with the appropriate amount of divergence or collimation for a particular depth plane associated with the waveguide. As a result, waveguides having different associated depth planes may have different configurations of outcoupling optical elements 282, 284, 286, 288, 290, which output light with a different amount of divergence depending on the associated depth plane. In some embodiments, the light extracting optical elements 282, 284, 286, 288, 290 may be volumetric or surface features, which may be configured to output light at specific angles. For example, the light extracting optical elements 282, 284, 286, 288, 290 may be volume holograms, surface holograms, and/or diffraction gratings. In some embodiments, the features 198, 196, 194, 192 may not be lenses; rather, they may simply be spacers (e.g., cladding layers and/or structures for forming air gaps).

In some embodiments, the outcoupling optical elements 282, 284, 286, 288, 290 are diffractive features that form a diffraction pattern, or "diffractive optical element" (also referred to herein as a "DOE"). Preferably, the DOE's have a sufficiently low diffraction efficiency so that only a portion of the light of the beam is deflected away toward the eye 4 with each intersection of the DOE, while the rest continues to move through a waveguide via total internal reflection. The light carrying the image information is thus divided into a number of related exit beams that exit the waveguide at a multiplicity of locations and the result is a fairly uniform pattern of exit emission toward the eye 4 for this particular collimated beam bouncing around within a waveguide.

In some embodiments, one or more DOEs may be switchable between "on" states in which they actively diffract, and "off" states in which they do not significantly diffract. For instance, a switchable DOE may comprise a layer of polymer dispersed liquid crystal, in which microdroplets comprise a diffraction pattern in a host medium, and the refractive index of the microdroplets can be switched to substantially match the refractive index of the host material (in which case the pattern does not appreciably diffract incident light) or the microdroplet can be switched to an index that does not match that of the host medium (in which case the pattern actively diffracts incident light).

Figure 14:
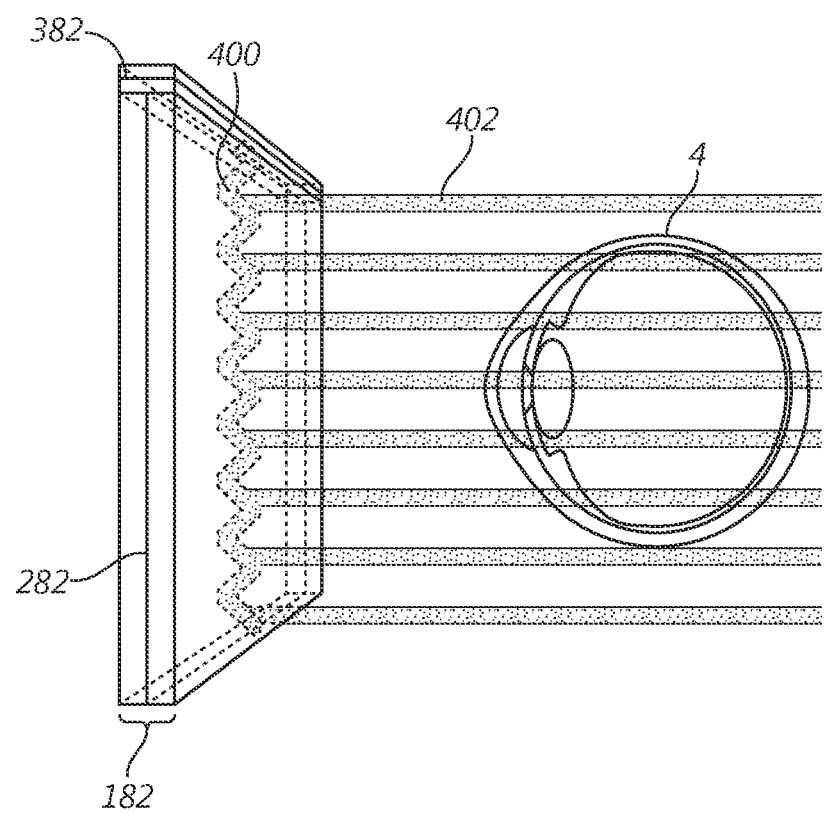
FIG. 14 illustrates an example of exit beams outputted by a waveguide.

FIG. 14 shows an example of exit beams outputted by a waveguide. One waveguide is illustrated, but it will be appreciated that other waveguides in the waveguide assembly 178 may function similarly, where the waveguide assembly 178 includes multiple waveguides. Light 400 is injected into the waveguide 182 at the input surface 382 of the waveguide 182 and propagates within the waveguide 182 by TIR. At points where the light 400 impinges on the DOE 282, a portion of the light exits the waveguide as exit beams 402. The exit beams 402 are illustrated as substantially parallel but, as discussed herein, they may also be redirected to propagate to the eye 4 at an angle (e.g., forming divergent exit beams), depending on the depth plane associated with the waveguide 182. It will be appreciated that substantially parallel exit beams may be indicative of a waveguide with outcoupling optical elements that outcouple light to form images that appear to be set on a depth plane at a large distance (e.g., optical infinity) from the eye 4. Other waveguides or other sets of outcoupling optical elements may output an exit beam pattern that is more divergent, which would require the eye 4 to accommodate to a closer distance to bring it into focus on the retina and would be interpreted by the brain as light from a distance closer to the eye 4 than optical infinity.

Various example embodiments of the invention are described herein. Reference is made to these examples in a non-limiting sense. They are provided to illustrate more broadly applicable aspects of the invention. Various changes may be made to the invention described and equivalents may be substituted without departing from the spirit and scope of the invention. For example, while advantageously utilized with AR displays that provide images across multiple depth planes, the augmented reality content disclosed herein may also be displayed by systems that provide images on a single depth plane. In addition, while advantageously applied as a light source for display systems, the light sources disclosed herein may be utilized in other applications where close spacing of the light emitter to other structures is desired.

In some embodiments, with reference to FIGS. 2A-6, the electrical contact may be omitted and a second contact (not shown) to the light emitter 610 may be made using a second interconnect (not shown) similar to the interconnect 640. For example, the second interconnect may be deposited over the substrate to contact a second light emitter bond pad (not shown) on an exposed surface of the light emitter 610 (e.g., on an upward-facing surface of the light emitter, opposite from the bond pad 650) and a second substrate bond pad (not shown) on the substrate 630. The second interconnect may be deposited by similar methods as the first interconnect 640 and, in some embodiments, a dielectric layer (not shown) similar to the dielectric layer 670 may be formed before depositing the second interconnect.

Many modifications may be made to adapt a particular situation, material, composition of matter, process, process act(s) or step(s) to the objective(s), spirit or scope of the present invention. Further, as will be appreciated by those with skill in the art that each of the individual variations described and illustrated herein has discrete components and features which may be readily separated from or combined with the features of any of the other several embodiments without departing from the scope or spirit of the present inventions. All such modifications are intended to be within the scope of claims associated with this disclosure.

The invention includes methods that may be performed using the subject devices. The methods may comprise the act of providing such a suitable device. Such provision may be performed by the user. In other words, the "providing" act merely requires the user obtain, access, approach, position, set-up, activate, power-up or otherwise act to provide the requisite device in the subject method. Methods recited herein may be carried out in any order of the recited events that is logically possible, as well as in the recited order of events.

Example aspects of the invention, together with details regarding material selection and manufacture have been set forth above. As for other details of the present invention, these may be appreciated in connection with the above-referenced patents and publications as well as generally known or appreciated by those with skill in the art. The same may hold true with respect to method-based aspects of the invention in terms of additional acts as commonly or logically employed.

In addition, though the invention has been described in reference to several examples optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the spirit and scope of the invention. In addition, where a range of values is provided, it is understood that every intervening value, between the upper and lower limit of that range and any other stated or intervening value in that stated range, is encompassed within the invention.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in claims associated hereto, the singular forms "a," "an," "said," and "the" include plural referents unless the specifically stated otherwise. In other words, use of the articles allow for "at least one" of the subject item in the description above as well as claims associated with this disclosure. It is further noted that such claims may be drafted to exclude any optional element. As such, this statement is intended to serve as antecedent basis for use of such exclusive terminology as "solely," "only" and the like in connection with the recitation of claim elements, or use of a "negative" limitation.

Without the use of such exclusive terminology, the term "comprising" in claims associated with this disclosure shall allow for the inclusion of any additional element-irrespective of whether a given number of elements are enumerated in such claims, or the addition of a feature could be regarded as transforming the nature of an element set forth in such claims. Except as specifically defined herein, all technical and scientific terms used herein are to be given as broad a commonly understood meaning as possible while maintaining claim validity.

The breadth of the present invention is not to be limited to the examples provided and/or the subject specification, but rather only by the scope of claim language associated with this disclosure.

What is claimed is:

1. A display system, comprising:
    a substrate comprising a substrate bond pad;
    a light emitter attached to the substrate, the light emitter comprising a light emitter bond pad and having horizontal and vertical surfaces;
    an electrical interconnect over the light emitter, the electrical interconnect contacting the light emitter bond pad at one end of the electrical interconnect and contacting the substrate bond pad at an other end of the electrical interconnect, wherein a cross-sectional shape of the electrical interconnect, as viewed in a plane transverse to an elongate axis of the electrical interconnect, has a width larger than a height of the cross-sectional shape, and wherein the electrical interconnect conformally follows and mimics a contour defined by the vertical and horizontal surfaces of the light emitter;
    a light pipe over an exposed surface of the light emitter; and
    a spatial light modulator configured to receive light from the light pipe and to modulate the light to define images.

2. The display system of claim 1, wherein a maximum height of the electrical interconnect above the light emitter is 50 μm or less.

3. The display system of claim 1, wherein the electrical interconnect conformally follows contours of the light emitter.

4. The display system of claim 3, wherein the light emitter defines a step over the substrate, wherein the electrical interconnect follows contours of the step.

5. The display system of claim 1, wherein the cross-sectional shape is rectangular.

6. The display system of claim 1, wherein the electrical interconnect comprises a metal.

7. The display system of claim 1, wherein the light emitter is a LED chip.

8. The display system of claim 1, wherein the substrate is a printed circuit board.

9. The display system of claim 1, further comprising a dielectric layer between the light emitter and the electrical interconnect.

10. The display system of claim 1, wherein the light emitter further comprises an other light emitter bond pad, and an other electrical interconnect contacting the other light emitter bond pad at one end of the other electrical interconnect and contacting an other substrate bond pad at an other end of the electrical interconnect,
    wherein a cross-sectional shape of the other electrical interconnect, as viewed in a plane traverse to an elongate axis of the electrical interconnect, has a width larger than a height.

11. The display system of claim 1, further comprising:
    a light modulating device configured to receive light from the light pipe; and
    a stack of waveguides, each waveguide comprising a light incoupling optical element configured to receive light from the light modulating device.

12. The display system of claim 11, further comprising a plurality of the light pipes, each light pipe configured to transmit light to the light modulating device.

13. The display system of claim 1, further comprising a reflector over an exposed surface of the light emitter.

14. The display system of claim 13, further comprising:
a light modulating device configured to receive light from the reflector; and
a waveguide comprising a light incoupling optical element configured to receive light from the light modulating device.

15. The display system of claim 14, wherein the waveguide includes a stack of waveguides configured to receive light from the light modulating device.

16. The display system of claim 14, further comprising a plurality of the reflectors, each reflector configured to direct light to the light modulating device.

17. A method for making a display device, comprising:
providing a substrate comprising a substrate bond pad;
attaching a light emitter to the substrate, the light emitter comprising a light emitter bond pad and having horizontal and vertical surfaces;
depositing an electrical interconnect over the light emitter, the electrical interconnect contacting the light emitter bond pad at one end of the electrical interconnect and contacting the substrate bond pad at an other end of the electrical interconnect, wherein a cross-sectional shape of the electrical interconnect, as viewed in a plane transverse to an elongate axis of the electrical interconnect, has a width larger than a height of the cross-sectional shape, and wherein the electrical interconnect conformally follows and mimics a contour defined by the vertical and horizontal surfaces of the light emitter; and
providing a light pipe over an exposed surface of the light emitter; and
providing a spatial light modulator configured to receive light from the light pipe and to modulate the light to define images.

18. The method of claim 17, wherein depositing the electrical interconnect comprises 3D printing the electrical interconnect.

19. The method of claim 17, further comprising depositing a dielectric material over the light emitter before depositing the electrical interconnect.

20. The method of claim 19, wherein depositing the dielectric material comprises 3D print the dielectric material.

* * * * *